US006992381B2

(12) United States Patent
Kim et al.

(10) Patent No.: US 6,992,381 B2

(45) Date of Patent: Jan. 31, 2006

(54) USING EXTERNAL RADIATORS WITH ELECTROOSMOTIC PUMPS FOR COOLING INTEGRATED CIRCUITS

(75) Inventors: Sarah E. Kim, Portland, OR (US); R. Scott List, Beaverton, OR (US); James G. Maveety, San Jose, CA (US); Alan M. Myers, Portland, OR (US); Quat T. Vu, Santa Clara, CA (US); Ravi Prasher, Phoenix, AZ (US); Ravi Mahajan, Tempe, AZ (US); Gilroy Vandentop, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 126 days.

(21) Appl. No.: 10/698,749

(22) Filed: Oct. 31, 2003

(65) Prior Publication Data

US 2005/0093138 A1 May 5, 2005

(51) Int. Cl.
*H01L 23/34* (2006.01)

(52) U.S. Cl. ................. 257/713; 361/699; 165/104.11; 417/313

(58) Field of Classification Search ................ 361/699; 165/104.11; 417/313
See application file for complete search history.

(56) References Cited

U.S. PATENT DOCUMENTS

2002/0184907 A1 12/2002 Vaiyapuri et al.
2003/0062149 A1 4/2003 Goodson et al. ....... 165/104.11
2003/0164231 A1 9/2003 Goodson et al.
2004/0190252 A1 * 9/2004 Prasher et al.

FOREIGN PATENT DOCUMENTS

EP 0 709 884 5/1996
WO WO 02/094440 11/2002

OTHER PUBLICATIONS

List et al., U.S. Appl. No. 10/402,435, filed Mar. 28, 2003, entitled "Electroosmotic Pump Using Nanoporous Dielectric Frit".
Kim et al., U.S. Appl. No. 10/669,205, filed Sep. 24, 2003, entilted "Integrated Re-Combiner for Electroosmotic Pumps Using Porous Frits".
Kim et al., U.S. Appl. No. 10/687,127, filed Oct. 16, 2003, entitled "Electroosmotic Pumps Using Porous Frits for Cooling Integrated Circuit Stacks".
Kim et al., U.S. Appl. No. 10/323,084, filed Dec. 18, 2002, entitled "Electro-Osomotic Pumps and Micro-Channels".

* cited by examiner

*Primary Examiner*—Mai-Huong Tran
(74) *Attorney, Agent, or Firm*—Trop, Pruner & Hu, P.C.

(57) ABSTRACT

An integrated circuit to be cooled may be abutted in face-to-face abutment with a cooling integrated circuit. The cooling integrated circuit may include electroosmotic pumps to pump cooling fluid through the cooling integrated circuits via microchannels to thereby cool the heat generating integrated circuit. The electroosmotic pumps may be fluidically coupled to external radiators which extend upwardly away from a package including the integrated circuits. In particular, the external radiators may be mounted on tubes which extend the radiators away from the package.

18 Claims, 9 Drawing Sheets

USING EXTERNAL RADIATORS WITH ELECTROOSMOTIC PUMPS FOR COOLING INTEGRATED CIRCUITS

BACKGROUND

This invention relates generally to cooling integrated circuits.

Electroosmotic pumps use electric fields to pump a fluid. In one application, they may be fabricated using semiconductor fabrication techniques. They then may be applied to the cooling of integrated circuits, such as microprocessors.

For example, an integrated circuit electroosmotic pump may be operated as a separate unit to cool an integrated circuit. Alternatively, the electroosmotic pump may be formed integrally with the integrated circuit to be cooled. Because the electroosmotic pumps, fabricated in silicon, have an extremely small form factor, they may be effective at cooling relatively small devices, such as semiconductor integrated circuits.

Thus, there is a need for better ways of cooling integrated circuits.

DETAILED DESCRIPTION

Figure 1:
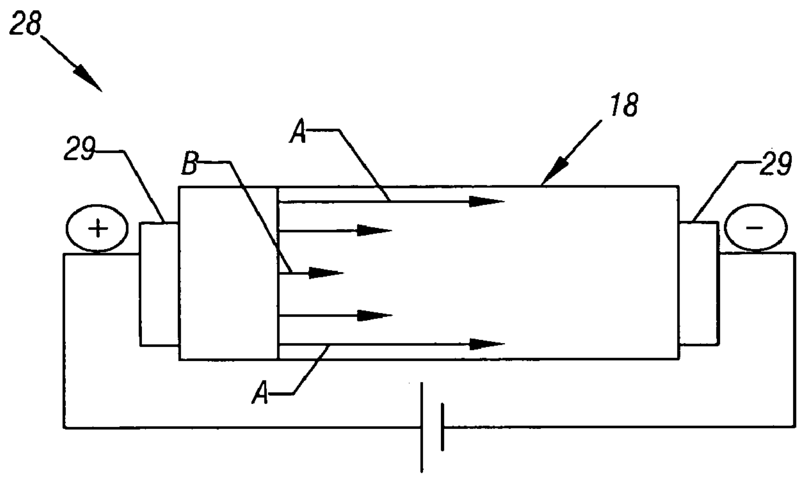
FIG. 1 is a schematic depiction of the operation of the embodiment in accordance with one embodiment of the present invention.

Referring to FIG. 1, an electroosmotic pump 28 fabricated in silicon is capable of pumping a fluid, such as a cooling fluid, through a frit 18. The frit 18 may be coupled on opposed ends to electrodes 29 that generate an electric field that results in the transport of a liquid through the frit 18. This process is known as the Electroosmotic effect. The liquid may be, for example, water and the frit may be composed of silicon dioxide in one embodiment. In this case hydrogen from hydroxyl groups on the wall of the frit deprotonate resulting in an excess of protons moving transversely to the wall or transversely to the direction of fluid movement, indicated by the arrows A. The hydrogen ions move in response to the electric field applied by the electrodes 29 in the direction of the arrows A. The non-charged water atoms also move in response to the applied electric field because of drag forces that exist between the ions and the water atoms.

As a result, a pumping effect may be achieved without any moving parts. In addition, the structure may be fabricated in silicon at extremely small sizes making such devices applicable as pumps for cooling integrated circuits.

In accordance with one embodiment of the present invention, the frit 18 may be made of an open and connected cell dielectric thin film having open nanopores. By the term "nanopores," it is intended to refer to films having pores on the order of 10 to 1000 nanometers. In one embodiment, the open cell porosity may be introduced using the sol-gel process. In this embodiment, the open cell porosity may be introduced by burning out the porogen phase. However, any process that forms a dielectric film having interconnected or open pores on the order of 10 to 1000 nanometers may be suitable in some embodiments of the present invention.

For example, suitable materials may be formed of organosilicate resins, chemically induced phase separation, and sol-gels, to mention a few examples. Commercially available sources of such products are available from a large number of manufacturers who provide those films for extremely low dielectric constant dielectric film semiconductor applications.

In one embodiment, an open cell xerogel can be fabricated with 20 nanometer open pore geometries that increase maximum pumping pressure by a few orders of magnitude. The xerogel may be formed with a less polar solvent such as ethanol to avoid any issues of water tension attacking the xerogel. Also, the pump may be primed with a gradual mix of hexamethyldisilazane (HMDS), ethanol and water to reduce the surface tension forces. Once the pump is in operation with water, there may be no net forces on the pump sidewalls due to surface tension.

Referring to FIGS. 2–9, the fabrication of an integrated electroosmotic pump 28 using a nanoporous open cell dielectric frit 18 begins by patterning and etching to define an electroosmotic trench.

Figure 2:
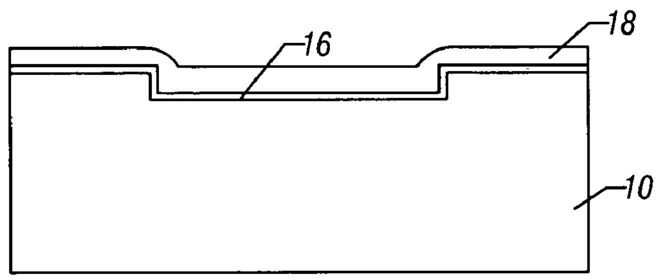
FIG. 2 is an enlarged cross-sectional view of one embodiment of the present invention at an early stage of manufacture.

Referring to FIG. 2, a thin dielectric layer 16 may be grown over the trench in one embodiment. Alternatively, a thin etch or polish-stop layer 16, such as a silicon nitride, may be formed by chemical vapor deposition. Other techniques may also be used to form the thin dielectric layer 16. The nanoporous dielectric layer 18 may than be formed, for example, by spin-on deposition. In one embodiment, the dielectric layer 18 may be in the form of a sol-gel. The deposited dielectric layer 18 may be allowed to cure.

Figure 3:
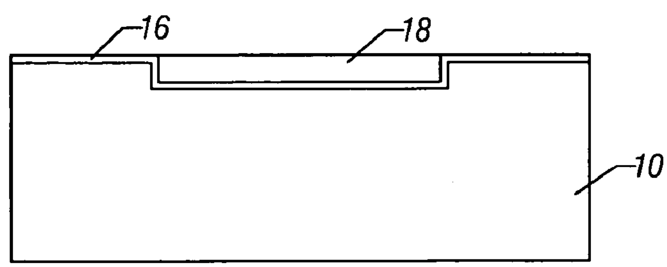
FIG. 3 is an enlarged cross-sectional view at a subsequent stage of manufacture in accordance with one embodiment of the present invention.

Then, referring to FIG. 3, the structure of FIG. 2 may be polished or etched back to the stop layer 16. As a result, a nanoporous dielectric frit 18 may be defined within the layer 16, filling the substrate trench.

Figure 4:
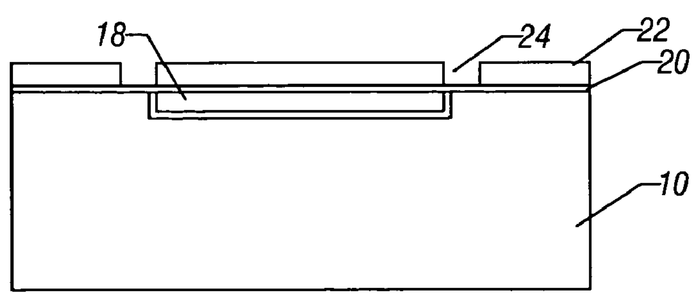
FIG. 4 is an enlarged cross-sectional view at a subsequent stage of manufacture in accordance with one embodiment of the present invention.

Referring next to FIG. 4, openings 24 may be defined in a resist layer 22 in one embodiment of the present invention. The openings 24 may be effective to enable electrical connections to be formed to the ends of the frit 18. Thus, the openings 24 may be formed down to a deposited oxide layer 20 that may encapsulate the underlying frit 18. In some embodiments, the deposited oxide layer 20 may not be needed.

Figure 5:
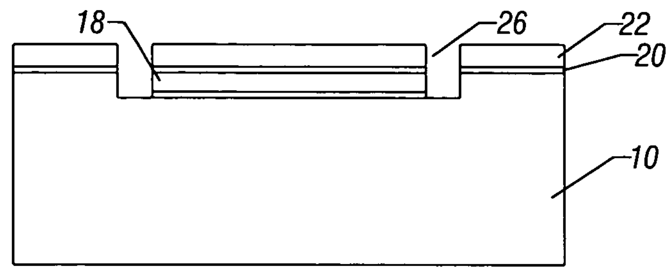
FIG. 5 is an enlarged cross-sectional view at a subsequent stage of manufacture in accordance with one embodiment of the present invention.
Figure 6:
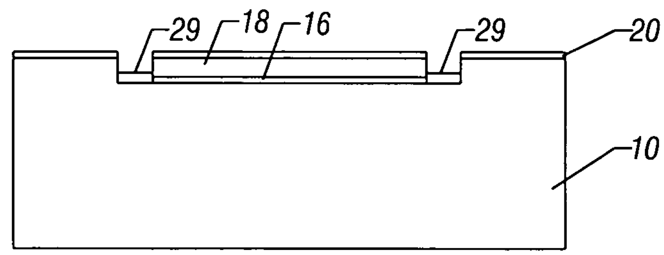
FIG. 6 is an enlarged cross-sectional view at a subsequent stage of manufacture in accordance with one embodiment of the present invention.

The resist 22 is patterned as shown in FIG. 4, the exposed areas are etched and then used as a mask to form the trenches 26 alongside the nanoporous dielectric layer 18 as shown in FIG. 5. Once the trenches 26 have been formed, a metal 29 may be deposited on top of the wafer In one embodiment, sputtering can be used to deposit the metal. The metal 29 can be removed by etching or lift-off techniques in such a manner as to leave metal only in the trench at the bottom of the trenches 26 as shown in FIG. 6. The metal 29 is advantageously made as thin as possible to avoid occluding liquid access to the exposed edge regions of the frit 18, which will ultimately act as the entrance and exit openings to the pump 28. The metal 29 may be thick enough, however, to assure adequate current flow without damage to the electrodes. Additionally, it is advantageous if the metal 29 also is deposited along the edges of the frit to a thickness which does not block the pore openings. This assures a uniform electric field along the entire depth of the frit.

Figure 7:
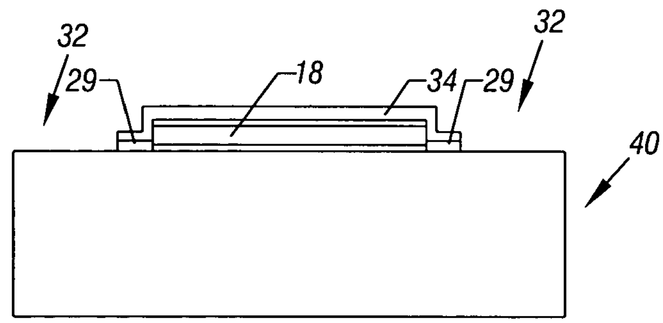
FIG. 7 is an enlarged cross-sectional view taken along the lines 7—7 in FIG. 8 at a subsequent stage of manufacture in accordance with one embodiment of the present invention.
Figure 8:
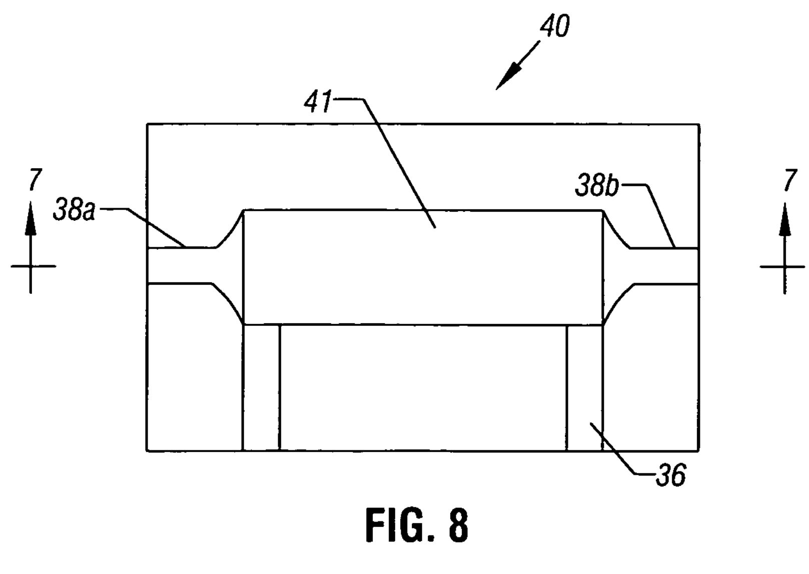
FIG. 8 is a top plan view of the embodiment shown in FIG. 8 in accordance with one embodiment of the present invention.

Referring to FIG. 7, a chemical vapor deposition material 34 may be formed over the frit 18 and may be patterned with photoresist and etched, as indicated at 32, to provide for the formation of channels 38 shown in FIG. 8. The channels 38 are etched through the deposited material 34 over the substrate 40. The channels 38 act as conduits to convey liquid to and from the rest of the pump 41. Also, electrical interconnections 36 may be fabricated by depositing metal (for example by sputtering), and removing the metal in selected areas (for example by lithographic patterning and etching across the wafer to enable electrical current to be supplied to the electrodes 29. This current sets up an electric field that is used to draw the fluid through the pump 28.

Figure 9:
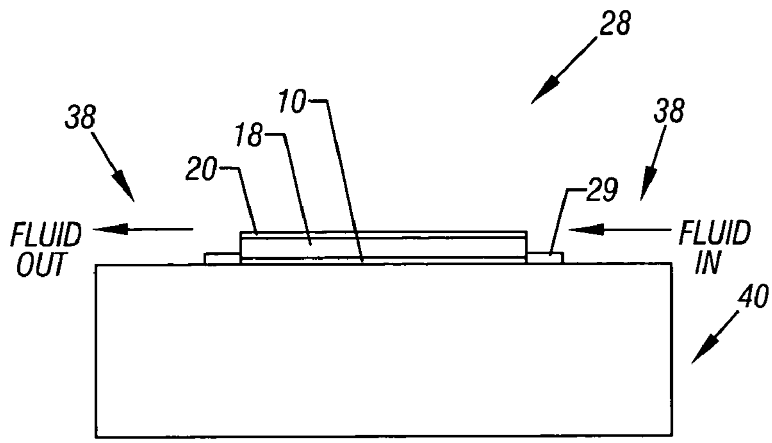
FIG. 9 is an enlarged cross-sectional view of a completed structure in accordance with one embodiment of the present invention.

Referring to FIG. 9, the fluid may pass through the microchannels 38 and enter the frit 18 by passing over the first electrode 29. The fluid is drawn through the frit 18 by the electric field and the disassociation process described previously. As a result, the fluid, which may be water, is pumped through the pump 28.

Figure 10:
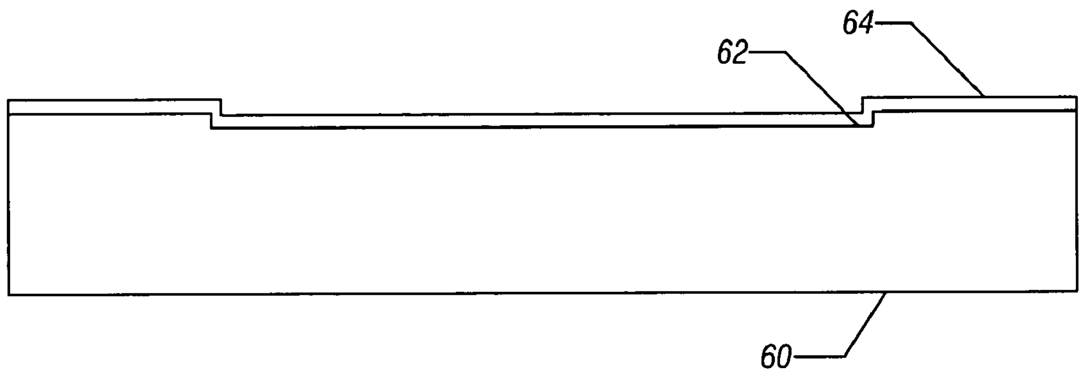
FIG. 10 is a depiction of a recombiner at an early stage of manufacture.
Figure 11:
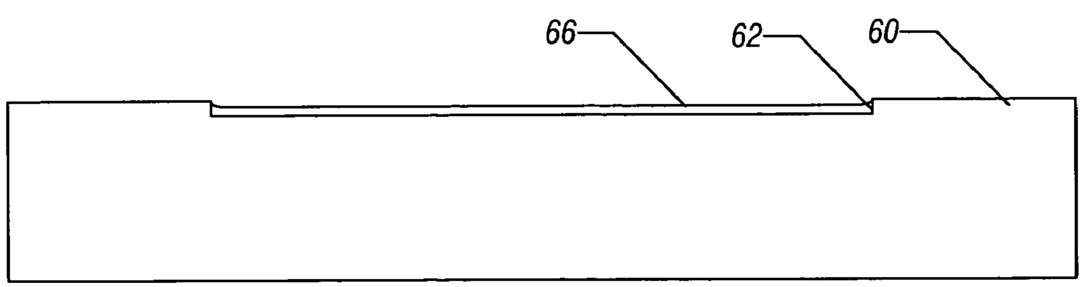
FIG. 11 is an enlarged cross-sectional view at a subsequent stage of manufacture in accordance with one embodiment of the present invention.
Figure 12:
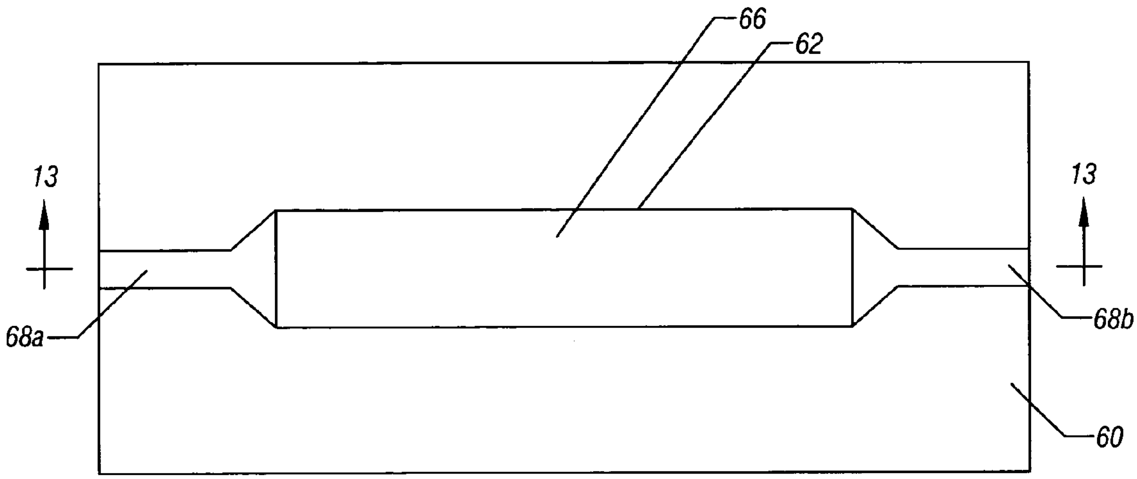
FIG. 12 is an enlarged top plan view at a subsequent stage of manufacture in accordance with one embodiment of the present invention.
Figure 13:
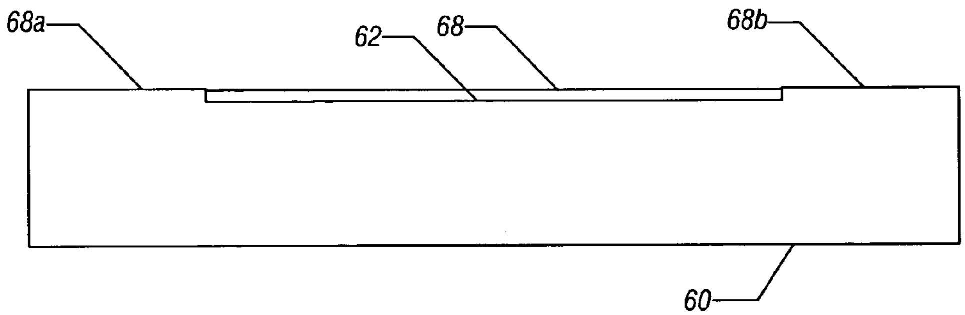
FIG. 13 is a cross-sectional view taken general along the line 13—13 in FIG. 12 in accordance with one embodiment of the present invention.

Referring now to FIGS. 10 through 17, one embodiment of a fabrication technique for making an integrated re-combiner is illustrated. Initially, a semiconductor substrate 60, such as a silicon wafer, may have a trench 62 formed therein by patterning and etching techniques, for example. Thereafter, a catalyst material 64, such as platinum, is sputter deposited as shown in FIG. 10. The catalyst material 64 is polished off the top of the wafer substrate 60 so only the portion 66 remains as shown in FIG. 11. A resist may be spun-on and patterned to form microchannels 68*a* and 68*b*, shown in FIGS. 12 and 13.

Figure 14:
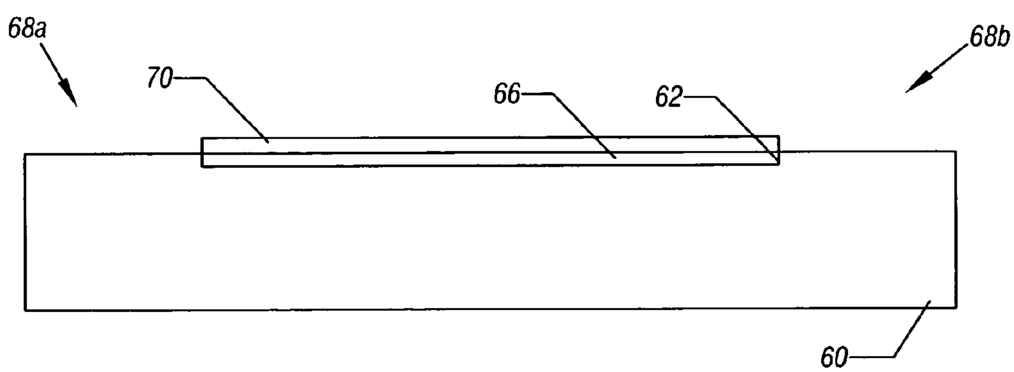
FIG. 14 is an enlarged cross-sectional view at a subsequent stage of manufacture in accordance with one embodiment of the present invention.
Figure 15:
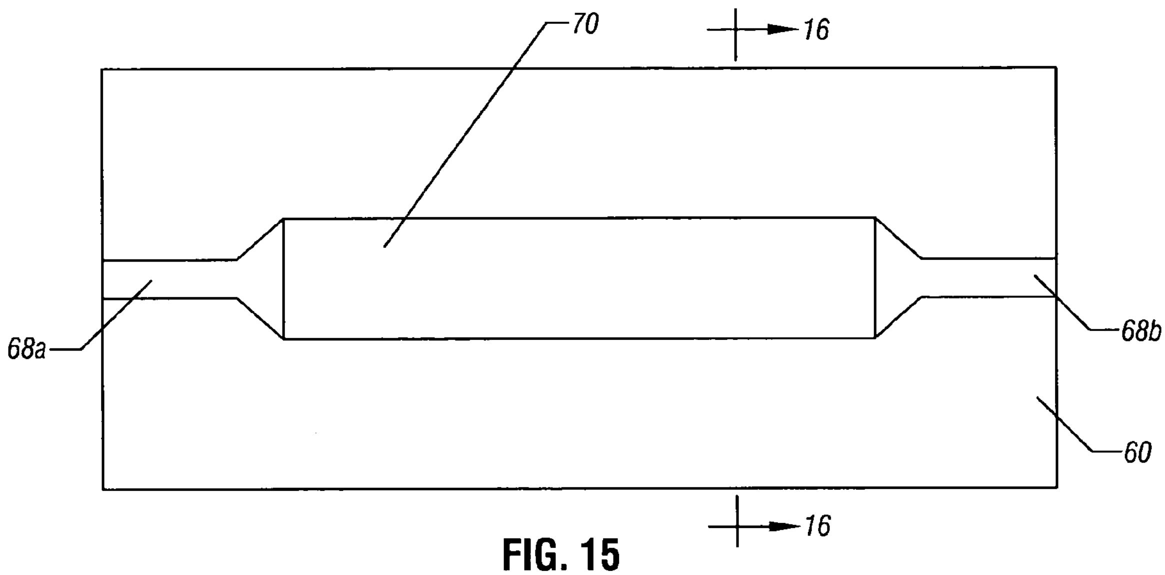
FIG. 15 is a top plan view of the embodiment shown in FIG. 14 at a subsequent stage of manufacture in accordance with one embodiment of the present invention.
Figure 16:
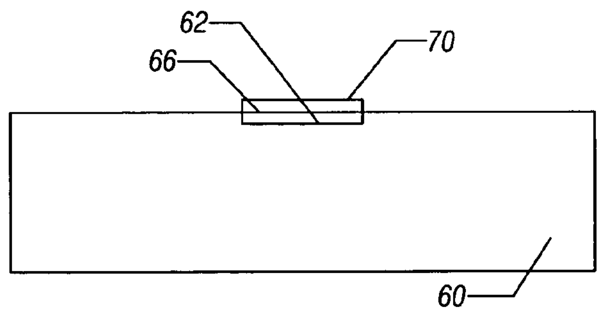
FIG. 16 is a cross-sectional view taken generally along the line 16—16 in FIG. 15 in accordance with one embodiment of the present invention.
Figure 17:
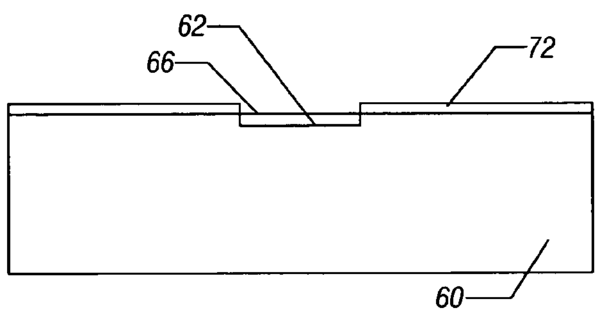
FIG. 17 is a cross-sectional view corresponding to FIG. 16 at a subsequent stage of manufacture in accordance with one embodiment of the present invention.

The microchannels 68*a* and 68*b* may be etched to the depth of the top of the catalyst material 66 and the resist used to do the etching may be cleaned. Then a resist 70 may be spun-on and ashed to clear the top of the wafer substrate 60, as shown in FIG. 14. A barrier, such as TiTiN, and copper 72 may be sputtered on top of the wafer substrate 60. A resist lift off may be used to remove the copper from the top of the catalyst material 66 and the microchannels 68*a* and 68*b* as shown in FIG. 17.

A porous Teflon layer (not shown) may be deposited over the wafer surface and either etched back or polished so that the Teflon covers the catalyst material 66 while having the copper 72 exposed. The Teflon layer protects the catalyst material 66 from getting wet when re-combined gas turns into water.

Figure 17A:
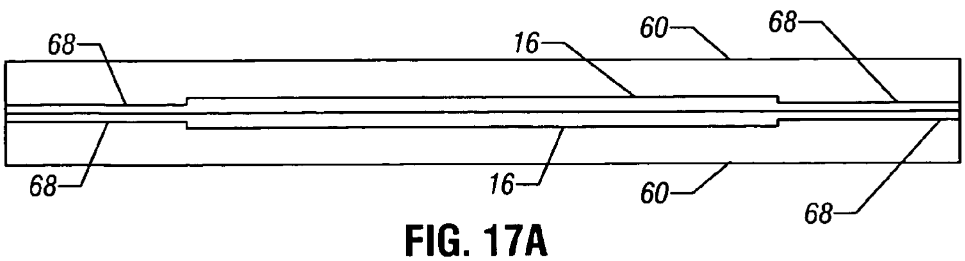
FIG. 17A is a side-elevational view of a re-combiner in accordance with one embodiment of the present invention.

A pair of identical substrates 60, processed as described above, may then be combined in face-to-face abutment to form a re-combiner 30 as shown in FIG. 17A. The substrates 60 may be joined by copper-to-copper bonding where there is no trench 16 or channel 68. Other bonding techniques, such as eutectic or direct bonding, may also be used to join the two wafers together. The trenches 16 and channels 68 may be aligned to form a passage for cooling fluid circulation over the catalyst material 66.

The re-combiner 30 may be used to reduce the buildup of gas in the cooling fluid pumped by the pump 28. Exposure of the gases to catalytic material 66 results in gas recombination. The re-combiner 30 may be made deep enough to avoid being covered with water formed from recombined gas and the cooling fluid itself.

Figure 18:
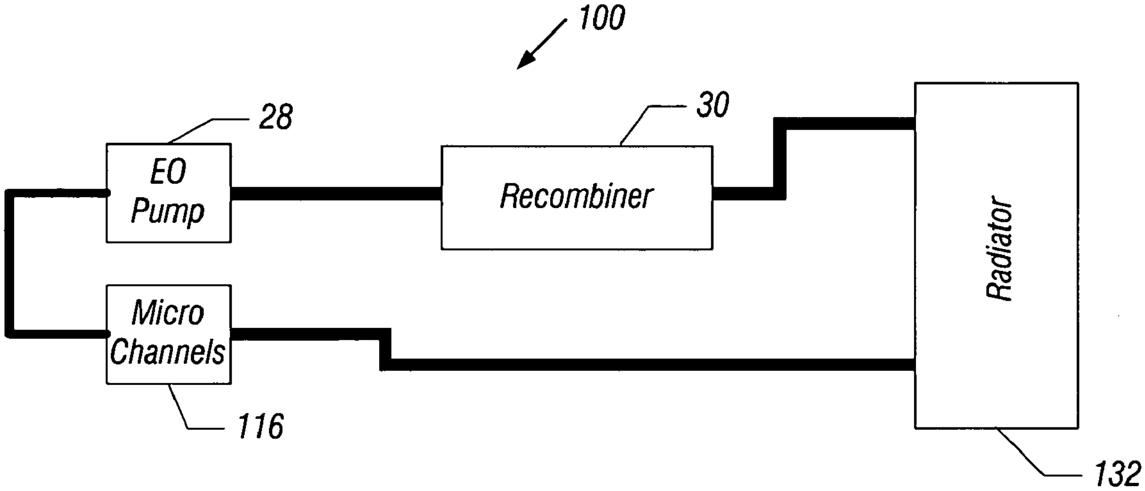
FIG. 18 is a schematic view of a packaged system in accordance with one embodiment of the present invention.

Electroosmotic pumps 28 may be provided in a system 100 coupled by fluid passageways as indicated in FIG. 18. The passageways couple a radiator 132, a re-combiner 30, and a set of microchannels 116 in a circuit or pathway for fluid. Thus, the fluid pumped by the pump 28 passes through the channel 116 and the re-combiner 30 to the radiator 132 where heat is removed to the surrounding environment. Thus, the microchannels 116, associated with an integrated circuit not shown in FIG. 18, provide cooling for that integrated circuit.

Figure 19:
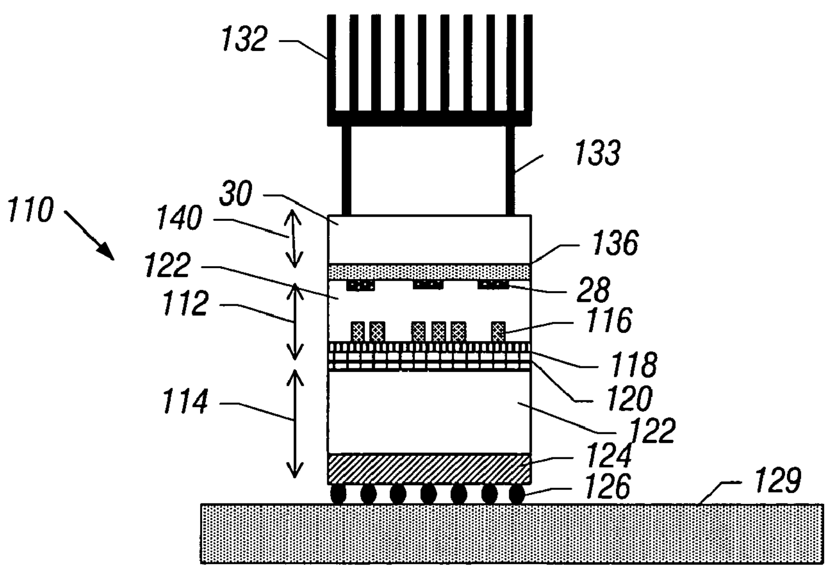
FIG. 19 is a cross-sectional view of a packaged system in accordance with another embodiment of the present invention.

Referring to FIG. 19, a surface mount or flip-chip package 129 may support an integrated circuit 124 having bump connections 126 to the package 129. The top side of the integrated circuit 124 faces towards the package 129.

The die 114 active semiconductor 124 is underneath the bulk silicon 122. The die 114 may be coupled to another die 112 by a copper-to-copper connection 120. That is, copper metal 120 on each die 112 and 114 may be fused to connect the dice 112 and 114. The die 112 may be bonded by glass, polymers, or dielectric bonding to the die 140.

The die 112 may include a dielectric layer 118 and a plurality of microchannels 116, which circulate cooling fluid. On the opposite side of the die 112 are a plurality of electroosmotic pumps 28 formed as described previously. A dielectric layer 136 couples the die 112 to a die 140, which forms the re-combiner 30. The re-combiner/condenser 30 may be coupled to an external radiator 132 such as a finned heat exchanger.

The external radiator 132 may be spaced from the rest of the system atop tubes 133 that enable fluid to be circulated through the body of the radiator 132. The use of an external radiator 132 enables the removal of more heat.

Exterior edges of the stack 110 may be sealed except for edge areas needed to provide fluid inflow and egress of the microchannels 116.

Thus, fluid may be circulated by the pumps 28 through the microchannels 116 to cool the die 114 active semiconductor 124. That fluid may be passed upwardly through appropriate passageways in the die 112 to the electroosmotic pumps 28. A pump liquid may then be communicated by appropriate passageways to the re-combiner/condenser 30.

In some embodiments, by providing a vertical stack 110 of three dice, a compact footprint may be achieved in a conventional package 129. The re-combiner 30 may be thermally insulated by the dielectric layer 136 from the lower, heat producing components.

Figure 20:
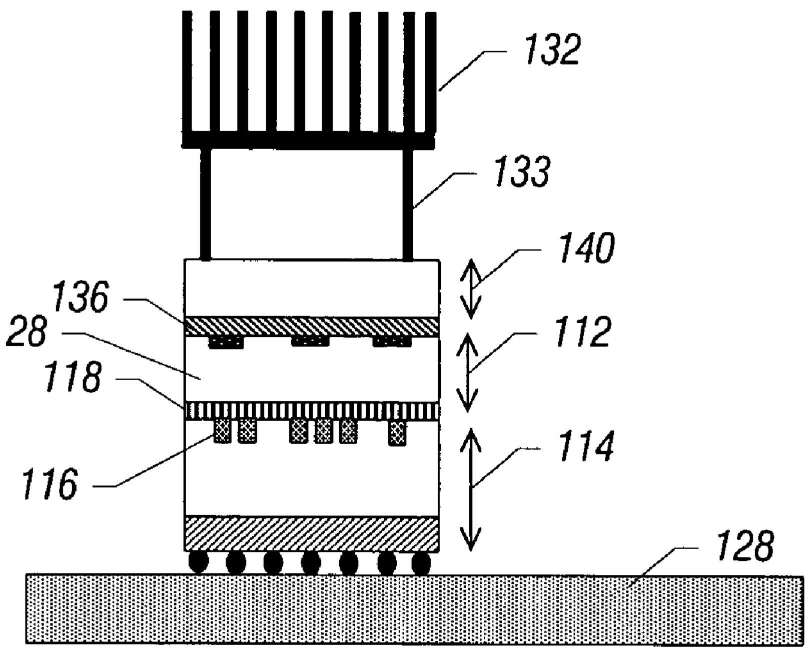
FIG. 20 is a cross-sectional view of a packaged system in accordance with another embodiment of the present invention.

Referring to FIG. 20, the structure shown therein corresponds in most respects to the structure shown in FIG. 19. The only difference is that the copper-to-copper bonding is eliminated. In this case, a glass, polymer, or dielectric bond process may be utilized to connect the dice 112 and 114, as well as the dice 112 and 140.

Figure 21:
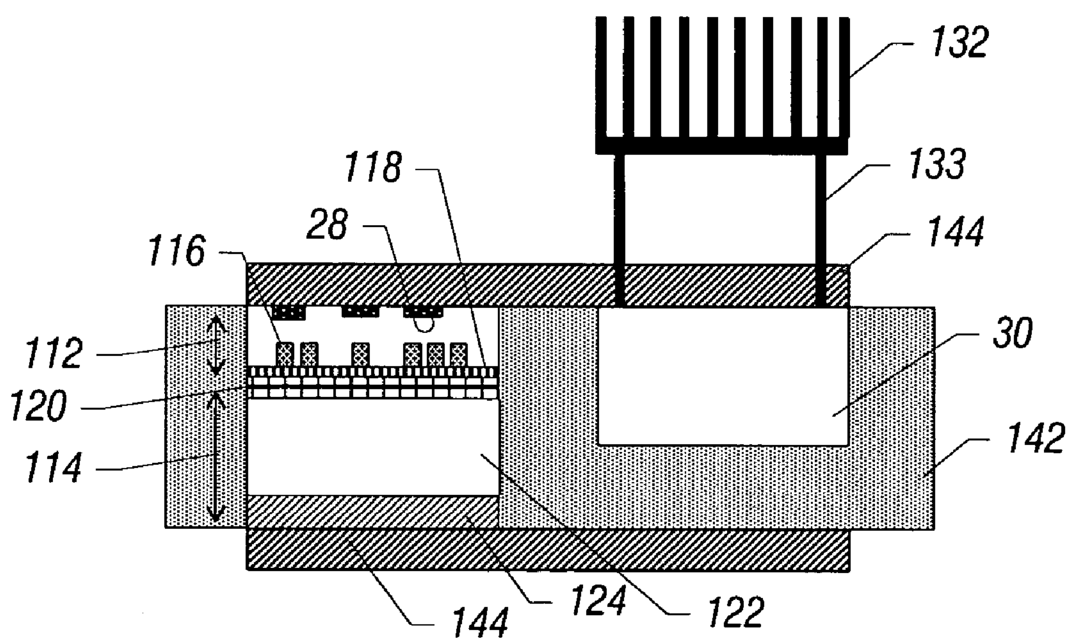
FIG. 21 is a schematic view of a cooling system in accordance with another embodiment of the present invention.

Referring to FIG. 21, a bumpless build-up layer (BBUL) package 142 is illustrated. The package 142 has build-up layers because the package is "grown" (built up) around the silicon die, rather than being manufactured separately and bonded to it. Bumpless build-up layer packaging is similar to flip-chip packaging except that no bumps are utilized and the device or core is embedded with the package. The build-up layers 144 provide multiple metal interconnection layers that enable electrical connections between the package pins and contacts on the dice 112 and 114 without the need for bumps.

The dice 112 and 114 are separately fabricated and, in this case, are bonded by a copper/copper bond as illustrated. The re-combiner 30 is inserted in the BBUL package 142 separately from the stack of the dice 112 and 114. Build-up layers 144 may be provided between the BBUL package 142 and the radiator 132 and on the bottom of the package 142. The build-up layers 144 serve to couple the re-combiner 30 to the stack including the dice 112 and 114. Channels may be built unto the layers 144 to couple fluid from pumps 28 and microchannels 116 to the recombiner 30 and from the recombiner 30 to the radiator 132.

Figure 22:
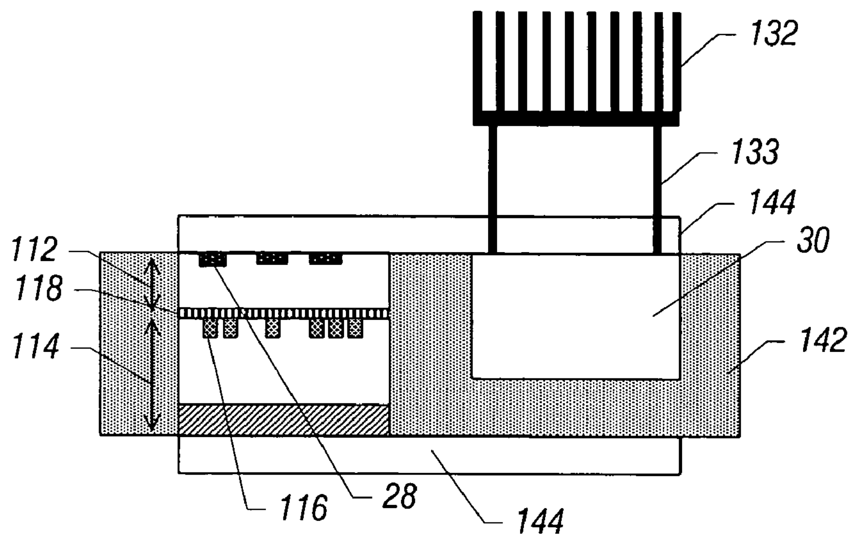
FIG. 22 is a schematic view of still another embodiment of the present invention.

Referring to FIG. 22, the structure therein corresponds to the structure shown in FIG. 21 but, again, the copper-to-copper bonding between the dice 112 and 114 is replaced with either polymer, dielectric, or glass bonding processes.

Figure 23:
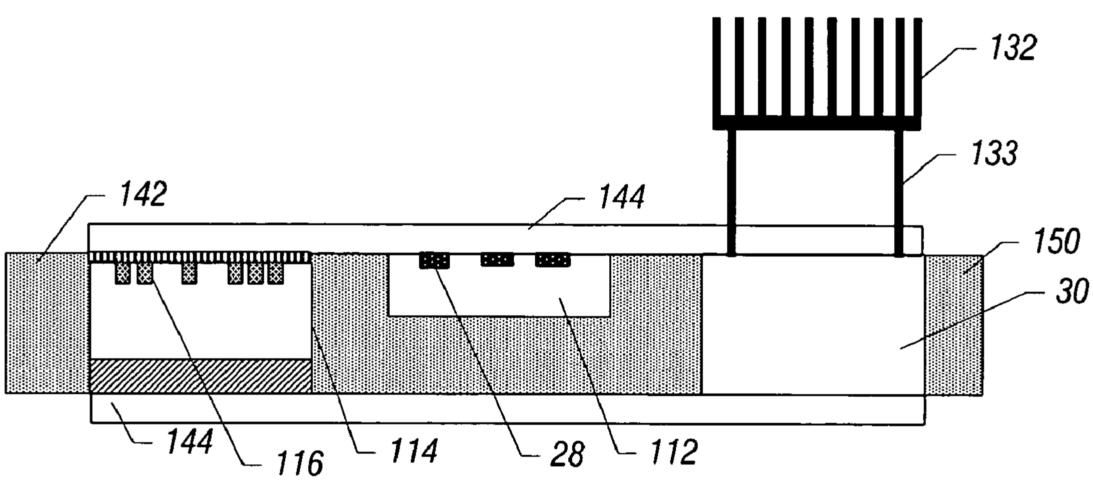
FIG. 23 is a schematic view of still another embodiment of the present invention.

Referring next to FIG. 23, a BBUL package 142 corresponds to the embodiment shown in FIG. 21, except that the dice 112 and 114 are not stacked. A build-up layer 144 couples the die 112 to the die 116 and the re-combiner 30.

Via channels may be used to couple the dice 112, 114, and 140. Alternatively, channels or tubes may be utilized for this purpose. The channels or tubes may be formed in the same structure or may be separate structures physically joined to the dies 112, 114, and 140 for this purpose.

Figure 24:
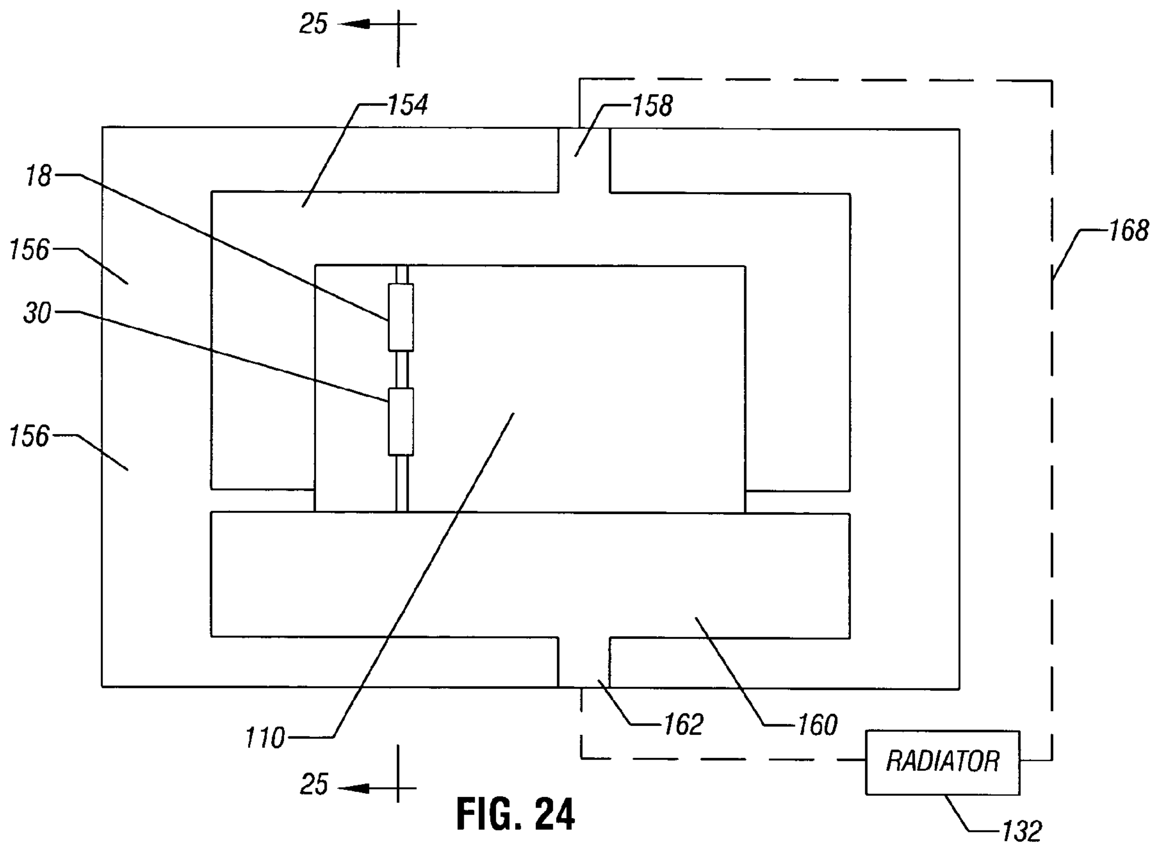
FIG. 24 is an enlarged, cross-sectional view through one embodiment of the present invention taken generally along the line 24—24 in FIG. 25.

As another example, referring to FIG. 24, a package 156 may have a first trench 154 and a second trench 160 which are isolated from one another. Interior edges of the trenches 154, 160 are defined by the die 114 which is inserted into the package 156. The trenches 154 and 160 may communicate with ports 158 and 162 which allow fluid to be added or exhausted from the package exterior. The edges of the die 114 are in communication with the fluid filled trench 154. Fluid from the fluid filled trench 154 may enter the stack 110 and may leave through the fluid filled trench 160. Fluid may be recirculated by tubing 168 which connects the ports 162 and 158. A radiator 132 may be coupled by the tubing 168.

Figure 25:
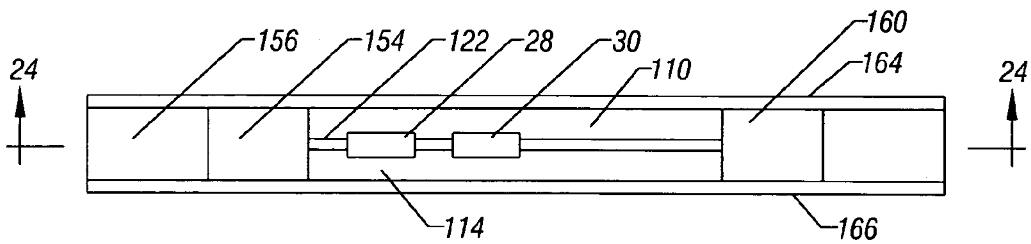
FIG. 25 is a cross-sectional view taken generally along the line 25—25 in FIG. 24 in accordance with one embodiment of the present invention.

Referring to FIG. 25, the fluid filled trench 154 may fluidically communicate with one or more microchannels 122, that in turn communicate with one or more electroosmotic pumps 28 and re-combiners 30. In this way, fluid may be pumped by the electroosmotic pump 28 for selective cooling of hot areas of the die 114. Upper and lower covers 164 and 166 may be included on the package in one embodiment of the present invention.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

securing an integrated circuit having microchannels formed therein to an integrated circuit to be cooled;

enabling a cooling fluid to be pumped through said microchannels by an electroosmotic pump within a microchannel; and coupling said cooling fluid to an external heat exchanger through tubes.

2. The method of claim 1 including packaging said cooling integrated circuit and said heat generating integrated circuit.

3. The method of claim 2 including extending tubes from said package to said external heat exchanger such that said heat exchanger is spaced from said package.

4. The method of claim 1 including forming a stack of said cooling integrated circuit and said heat generating integrated circuit.

5. The method of claim 4 including sealing the edges of said stack except for ports to access said microchannels.

6. The method of claim 5 including providing a fluid inlet reservoir and a fluid outlet reservoir in communication with said microchannels.

7. The method of claim 6 including forming said reservoirs in a package including said stack.

8. The method of claim 7 including isolating said inlet and outlet reservoirs in said package.

9. The method of claim 8 including coupling said inlet and outlet reservoirs exteriorly of said package.

10. A method comprising:

securing an integrated circuit having microchannels formed therein to an integrated circuit to be cooled;

enabling a cooling fluid to be pumped through said microchannels by an electroosmotic pump within a microchannel;

coupling said cooling fluid to an external heat exchanger through tubes; and recombining gas using a recombiner formed in said microchannel in series with said pump.

11. The method of claim 10 including packaging said cooling integrated circuit and said heat generating integrated circuit.

12. The method of claim 11 including extending tubes from said package to said external heat exchanger such that said heat exchanger is spaced from said package.

13. The method of claim 10 including forming a stack of said cooling integrated circuit and said heat generating integrated circuit.

14. The method of claim 13 including sealing the edges of said stack except for ports to access said microchannels.

15. The method of claim 14 including providing a fluid inlet reservoir and a fluid outlet reservoir in communication with said microchannels.

16. The method of claim 15 including forming said reservoirs in a package including said stack.

17. The method of claim 16 including isolating said inlet and outlet reservoirs in said package.

18. The method of claim 17 including coupling said inlet and outlet reservoirs exteriorly of said package.

* * * * *